United States Patent
Seberger (10) Patent No.: US 9,876,349 B2
(45) Date of Patent: Jan. 23, 2018

(54) INTRINSICALLY SAFE VOLTAGE CLAMPING DEVICE

(71) Applicant: FISHER CONTROLS INTERNATIONAL LLC, Marshalltown, IA (US)

(72) Inventor: Stephen G. Seberger, Marshalltown, IA (US)

(73) Assignee: FISHER CONTROLS INTERNATIONAL LLC, Marshalltown, IA (US)

( * ) Notice: Subject to any disclaimer, the term of this patent is extended or adjusted under 35 U.S.C. 154(b) by 0 days.

(21) Appl. No.: 14/788,199

(22) Filed: Jun. 30, 2015

(65) Prior Publication Data

US 2015/0303682 A1    Oct. 22, 2015

Related U.S. Application Data

(63) Continuation of application No. 14/090,737, filed on Nov. 26, 2013, now Pat. No. 9,203,236.

(Continued)

(51) Int. Cl.
*H02H 9/00* (2006.01)
*H02H 9/02* (2006.01)
(Continued)

(52) U.S. Cl.
CPC ............ *H02H 9/02* (2013.01); *H02H 1/0007* (2013.01); *H02H 9/043* (2013.01); *H02H 5/042* (2013.01);
(Continued)

(58) Field of Classification Search
USPC .................................. 361/56, 93.7–93.9, 103
See application file for complete search history.

(56) References Cited

U.S. PATENT DOCUMENTS 4,698,655 A * 10/1987 Schultz ............... H01L 27/0259
257/108
5,091,818 A   2/1992 Morikawa et al.
(Continued)

FOREIGN PATENT DOCUMENTS

DE    19811269 C1    10/1999
EP    2605355 A1    6/2013
(Continued)

OTHER PUBLICATIONS

International Electrotechnical Commission, IEC 60079-11 Ed. 6.0: Explosive atmospheres Part 11: Equipment protection by intrinsic safety '7, Final Draft International Standard, Distributed Mar. 11, 2011.

(Continued)

*Primary Examiner* — Danny Nguyen
(74) *Attorney, Agent, or Firm* — Marshall, Gerstein & Borun LLP (57) ABSTRACT

An intrinsically safe voltage clamping device includes a regulated rail, a ground rail, and a shunt regulator assembly. The shunt regulator assembly is coupled to both the regulated rail and the ground rail and includes one or more regulating components. The shunt regulator assembly is configured to clamp a voltage applied across the regulated rail and the ground rail to a safety clamp voltage value. The intrinsically safe voltage clamping device also includes a power-sensing component configured to cause one or more limiting components to reduce a power dissipated in the respective regulating components without raising the clamp voltage.

18 Claims, 5 Drawing Sheets

Related U.S. Application Data (60) Provisional application No. 61/896,475, filed on Oct. 28, 2013.

(51) Int. Cl.
*H02H 1/00* (2006.01)
*H02H 5/04* (2006.01)
*H03K 17/08* (2006.01)
*H02H 9/04* (2006.01)

(52) U.S. Cl.
CPC ....... *H02H 9/04* (2013.01); *H03K 2017/0806* (2013.01)

(56) References Cited

U.S. PATENT DOCUMENTS

| | | | |
|---|---|---|---|
| 6,400,545 B1 | 6/2002 | Baba | |
| 7,626,795 B2* | 12/2009 | Sander | H02H 3/08 361/93.1 |
| 8,325,454 B2* | 12/2012 | Brugner | H01R 13/6683 361/103 |
| 2004/0174648 A1 | 9/2004 | Frey et al. | |
| 2009/0146624 A1* | 6/2009 | Kim | G05F 1/613 323/271 |
| 2012/0038345 A1 | 2/2012 | Poremba et al. | |
| 2012/0161726 A1 | 6/2012 | Levan et al. | |
| 2012/0236456 A1* | 9/2012 | Yu | H03K 17/0822 361/91.1 |
| 2015/0146332 A1* | 5/2015 | Seberger | H02H 9/02 361/57 |

FOREIGN PATENT DOCUMENTS

| | | |
|---|---|---|
| WO | WO-00/59094 A2 | 10/2000 |
| WO | WO-2012/045795 A1 | 4/2012 |

OTHER PUBLICATIONS

IEC 60079-11 Ed. 6.0: Explosive atmospheres Part 1: Equipment protection by intrinsic safety "i" Final Draft International Standard Projet final De Norme Internationale 31G/207/FDIS.

NXP Semiconductors, Low Voltage Adjustable Precision Shunt Regulators—Product Data Sheet—TLVH431 family, Rev. 1, Apr. 27, 2012 http://www.nxp.com/documents/data_sheet/TLVH431_FAM.pdf.

ST Microelectronics, Programmable Shunt Voltage Reference Datasheet—TLVH431, Rev. 1, Jun. 2012 http://www.st.com/web/en/resource/technical/document/datasheet/DM00057412.pdf.

Texas Instruments, Low-Voltage Adjustable Precision Stunt Regulators, TLVH431, TLVH431A. TLVH4818, TLVH432, TLVH432A, TLVH4828 SLVS5551, Sep. 2009 http://www.ti.com/lit/ds/symlink/tlvh432.pdf.

International Search Report and Written Opinion issued in PCT/US2014/062626 dated Jan. 30, 2015.

Office Action issued in Canadian Pat. Appl. No. 2,909,482 dated Dec. 10, 2015.

Office Action issued in Canadian Patent Application No. 2,909,482 dated Mar. 16, 2016.

\* cited by examiner

INTRINSICALLY SAFE VOLTAGE CLAMPING DEVICE

RELATED APPLICATIONS

This application claims the benefit of priority to U.S. patent application Ser. No. 14/090,737, filed Nov. 26, 2013 and entitled "INTRINSICALLY SAFE VOLTAGE CLAMPING DEVICE," and to U.S. Provisional Patent Application No. 61/896,475 filed Oct. 28, 2013, and entitled "VOLTAGE CLAMP DEVICE FOR INTRINSIC SAFETY," each of which is hereby incorporated by reference herein, in its entirety, for all purposes.

FIELD OF THE DISCLOSURE

The present disclosure is directed to an intrinsically safe device and, more particularly, to an intrinsically safe voltage clamping device with thermal and/or power limiting.

BACKGROUND

Some industrial processes, such as those in the petroleum industry, require devices to operate in hazardous atmospheres or other dangerous conditions. Such devices are often governed by an "intrinsically safe" standard, such as the ISA-60079-11 standard, specifying certain conditions for devices in hazardous atmospheres. The conditions seek to either limit the amount of energy stored in device circuitry (e.g., by limiting voltages to capacitors or currents to inductors) or limit the discharge of accumulated energy (e.g., by restricting the spacing of components) such that a discharge of energy will not cause an ignition. Further, in the case of the ISA-60079-11 standard, a circuit must remain safe during normal operation of the circuit even with a certain number of faults.

In some standards, an individual apparatus (or device) is treated differently than an assembly of components that is part of a larger apparatus. In the ISA-60079-11 standard, for example, a shunt safety assembly manufactured as an individual apparatus must adhere to a different section of the standard, as compared with a shunt safety assembly that is part of a larger apparatus. The differing requirements for an individual apparatus can allow manufacturers to produce devices with advantageous properties, such as physically compact packages. However, such self-contained voltage clamping devices can also suffer from failures related to overheating, making them impractical in many applications.

SUMMARY

An intrinsically safe voltage clamping device comprises a regulated rail, a ground rail, and a shunt regulator assembly. The shunt regulator assembly is coupled to both the regulated rail and the ground rail and includes one or more regulating components. Also, the shunt regulator assembly is configured to clamp a voltage applied across the regulated rail and the ground rail to a safety clamp voltage value. The intrinsically safe voltage clamping device also includes a thermally activated component configured to, when the temperature of at least one of the regulating components exceeds a threshold value, cause one or more limiting components to reduce a power dissipated in the at least one of the regulating components.

In another embodiment, a process control device comprises a device component having first and second terminals, the device component storing energy when a voltage is applied across the first and second terminals of the device component. The process control device also includes two or more voltage clamping devices electrically coupled to the device component. Each voltage clamping device is disposed in parallel with the other of the voltage clamping devices, and each voltage clamping device is configured to clamp the voltage applied across the device component to a safety clamp voltage. Further, each voltage clamping device comprises a shunt regulator assembly including one or more regulating components, and a thermally activated component configured to, when the temperature of at least one of the regulating components exceeds a threshold value, cause one or more limiting components to reduce a power dissipated in the at least one of the regulating components.

In another embodiment an intrinsically safe voltage clamping device comprises a regulated rail, a ground rail, and a shunt regulator assembly. The shunt regulator assembly is coupled to both the regulated rail and the ground rail and includes one or more regulating components. Also, the shunt regulator assembly is configured to clamp a voltage applied across the regulated rail and the ground rail to a safety clamp voltage value. The intrinsically safe voltage clamping device also includes a current-sensing resistor configured to, when the current through the resistor exceeds a threshold value, cause one or more limiting components to reduce a power dissipated in the at least one of the regulating components.

DETAILED DESCRIPTION

The present disclosure is directed to an intrinsically safe voltage clamping device and, specifically, to preventing thermal damage to voltage regulating device components in a self-contained device package via thermal- and/or power-limiting components. In particular, a voltage clamping device according to the present disclosure meets the functional requirements of a shunt voltage regulator while, at the same time, allowing for a physically compact and intrinsically safe packaging. In embodiments, thermally limiting components are utilized to automatically lower the clamp voltage of the device and reduce power dissipation in one or more regulating components. As a result, the limiting components may protect the voltage regulating components of the device against damage related to overheating while maintaining the safety-critical maximum clamp voltage.

Figure 1:
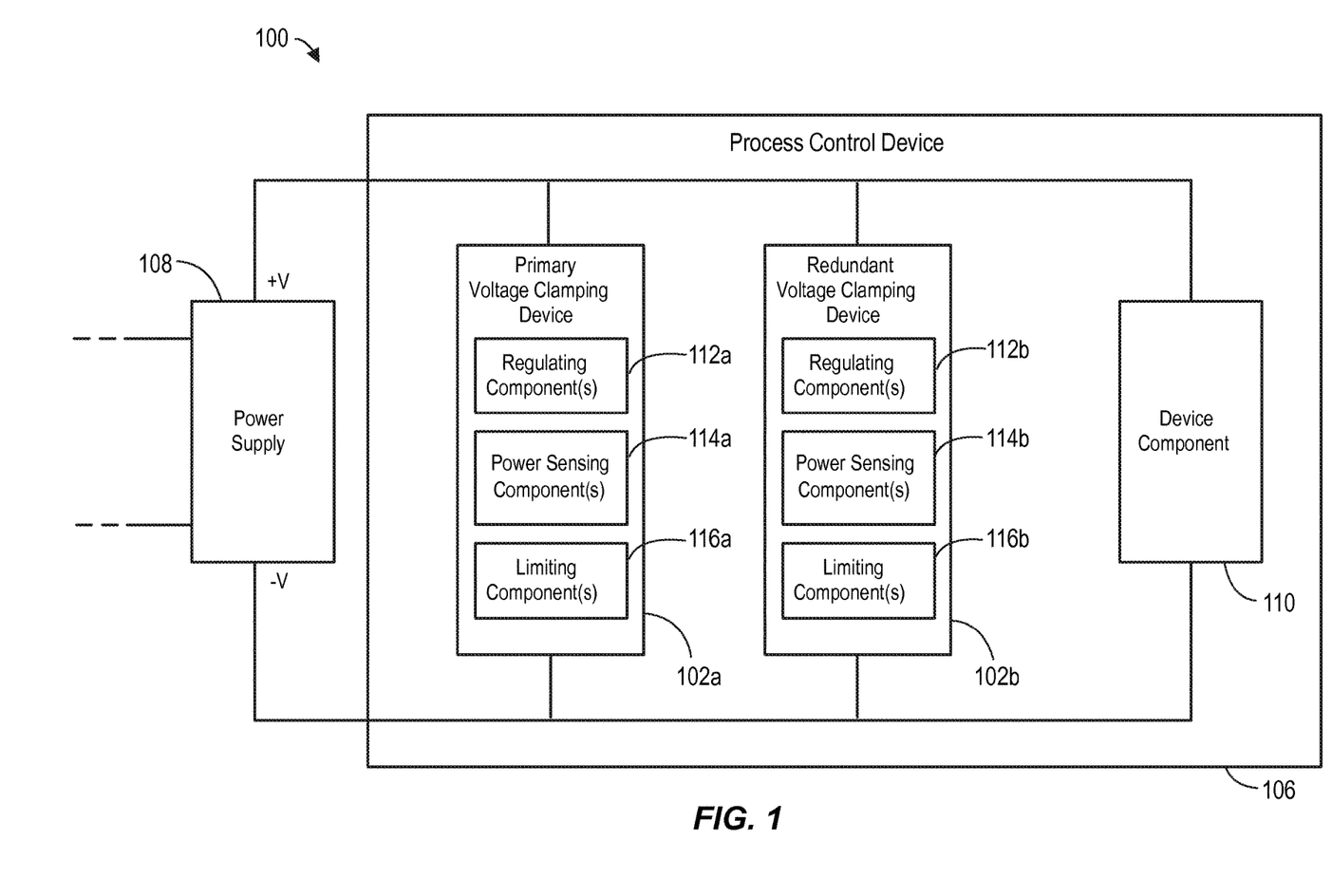
FIG. 1 is a block diagram of an example system in which primary and redundant voltage clamping devices are implemented.

Referring now to FIG. 1, an example system 100 constructed in accordance with one embodiment of the present disclosure includes a process control device 106 and a power supply 108. Primary and redundant voltage clamping devices 102a and 102b may limit the voltage applied across a device component 110 to a respective safety clamp voltage, in an implementation. By including two voltage clamping devices 102a and 102b, the system 100 may adhere to an intrinsically safe (IS) standard requiring continued voltage clamping upon failure of one of the voltage clamping devices 102a and 102b. An example voltage clamping device is discussed in more detail with reference to FIGS. 2A and 2B.

While depicted in FIG. 1 as being inside the process control device 106, the primary and redundant voltage clamping devices 102a and 102b may be internal or external to the process control device. The voltage clamping devices 102a and 102b may be modular devices which can be removably coupled to the process control device 106, or the voltage clamping devices 102a and 102b may be stand-alone devices which may be electrically coupled to the process control device via any combination of electrical leads. In general, the voltage clamping devices 102a and 102b may be coupled to or part of the process control device 106 via any suitable internal or external electrical connections, terminals, etc.

The process control device 106 may include a switch, transmitter, thermocouple, solenoid valve, etc., and, in particular, the process control device 106 may include the device component 110. The device component 110 may be any type of circuit component or assembly of components that stores energy when a voltage is applied across the device component 110. For example, the device component 110 may include one or more capacitors or inductors. Although only one device component 110 is illustrated in FIG. 1, it is clear that a process control device may have any number of components capable of storing energy.

The process control device 106 may be part of a manufacturing plant, oil or gas extraction structure, refinery, HVAC (heating, ventilation, and air conditioning) system, etc. in which the process control device 102a is exposed to a hazardous environment, such as an environment with hazardous gases, chemicals, vapors, dusts, fibers, etc. As such, the process control device 106 may be an intrinsically safe process control device 106, or the process control device 106 may be made intrinsically safe in combination with the voltage clamping devices 102a and 102b.

The example power supply 108 may power the process control device and may be operatively connected to both the process control device 106 and the voltage clamping devices 102a and 102b, where the process control device 106 and the voltage clamping devices 102a and 102b are connected in parallel (e.g., via two terminals of the process control device 106 and two leads of the voltage clamping devices 102a and 102b). The power supply 108 provides power to various components and may, in some cases, provide operating voltages for other circuits or components. For example, the power source 108 may provide output positive and negative voltages that are, in turn, applied to the rails of the voltage clamping devices 102a and 102b and the device component 110. The positive and negative voltages are denoted in FIG. 1 as +V and −V, respectively, but it is understood that a positive voltage may be applied to one of the voltage clamping devices 102a and 102b and the device component 110 and the other of the rails may be grounded.

The power supply 108 may be coupled to a mains power source, for example, or the power supply 108 may be coupled to battery power source. Also, the power supply 108 may, in some cases, transform a power signal (e.g., 24V) to particular voltages (e.g., ±3.3V, ±10V), where the particular voltages can be applied across rails of the voltage clamping devices 102a and 102b and the device component 110.

In some implementations, the voltage clamping devices 102a and 102b include: (i) regulating components 112a and 112b, respectively, such as components that are part of a shunt voltage regulating assembly (transistors, amplifiers, voltage references, etc.); (ii) power-sensing components 114a and 114b, respectively, such as thermistors, other temperature sensors, current sensors, etc.; and (iii) one or more limiting components 116a and 116b, respectively, such as diodes, transistors, etc., configured to selectively reduce power dissipation in the regulating components 112a and 112b based on activation of the power-sensing components 114a and 114b. Additionally, though described here as "power-sensing," the components 114a and 114b may, instead, control the limiting components 116a and 116b according to another parameter value, such as a parameter value related to or relatable to the temperature of the regulating components 112a and 112b, as will be described below with respect to FIGS. 2A and 2B.

The regulating components 112a and 112b may include any components of respective shunt voltage regulator assemblies in the voltage clamping devices 102a and 102b. The regulating component 112a may include, for example, a transistor, amplifier, and/or voltage reference device disposed between a regulated rail and ground rail of the voltage clamping device 102a. In some cases, a failure (e.g., due to overheating) of the regulating component 112a may cause the voltage clamping device 102a to lose the ability to clamp a voltage (e.g., applied across the device component 110) to a safety clamp voltage.

Figure 2A:
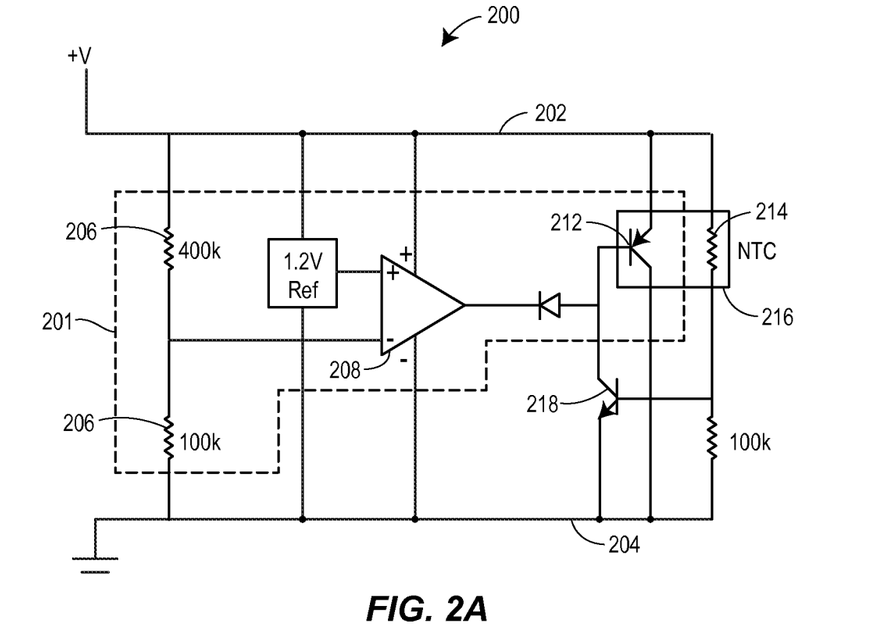
FIG. 2A illustrates an example circuit which may be packaged as an intrinsically safe voltage clamping device and implemented as one of the voltage clamping devices illustrated in FIG. 1.

To prevent failure of the regulating components 112a and 112b due to overheating, the regulating components 112a and 112b may be coupled to the power-sensing components 114a and 114b (as in FIG. 2A). The coupling between one of the regulating components 112a and 112b and the respective power-sensing component 114a or 114b may include thermal bonding between the components. For example, the thermal bonding may include a thermal pad or thermal transfer grease to assist in the transfer of heat from the one of the regulating components 112a and 112b to the respective power-sensing component 114a or 114b.

By allowing heat transfer from one of the regulating components 112a and 112b to a respective power-sensing component 114a and 114b, the power-sensing component 114a or 114b may be activated (e.g., at a certain threshold temperature). When activated, the power-sensing components 114a and 114b may activate respective limiting components 116a and 116b. The limiting components 116a and 116b may include any suitable circuit components (e.g., diodes, transistors, and resistors) electrically coupled to shunt voltage regulating assemblies of the voltage clamping devices 102a and 102b, such that the limiting components 116a and 116b reduce power dissipation in the regulating components 112a and 112b. By reducing the power dissipated in the regulating components 112a and 112b, the limiting components 116a and 116b may reduce the temperature of the regulating components 112a and 112b and prevent overheating.

In addition to being activated by the power-sensing components 114a and 114b, the limiting components 116a and 116b may be de-activated when the power-sensing components 114a and 114b detect a sufficient decrease in the temperature of the regulating components 112a and 112b. That is, after a temperature of the regulating components 112a and 112b is reduced (e.g., below a threshold), the corresponding power-sensing component 114a and 114b and limiting components 116a and 116b may be de-activated.

In other embodiments, the components 114a and 114b are not thermally coupled to the regulating components 112a and 112b, and instead regulate the temperature of the regulating components 112a and 112b according to the power dissipated in the components 112a and 112b. In one embodiment, for example, the components 114a and 114b may sense a transistor junction voltage of a transistor in the regulating components 112a and 112b. When the components 114a and 114b detect a decrease in the transistor junction voltage, the components 114a and 114b can cause the limiting components 116a and 116b to decrease the power dissipated by the regulating components 112a and 112b.

In another embodiment, the components 114a and 114b are configured to sense voltage across and current through the regulating components 112a and 112b, respectively, and to calculate the power being dissipated in the regulating components 112a and 112b. When the power exceeds a threshold value, the components 114a and 114b may cause the limiting components 116a and 116b, respectively, to limit the voltage (e.g., by decreasing the clamp voltage) and/or current, thereby decreasing the power dissipated in the components 112a and 112b and, accordingly, the temperature increase associated with that power dissipation.

In any event, the thermal limiting of the regulating components 112a and 112b may facilitate the components of the voltage clamping devices 102a and 102b being packaged in a compact and self-contained device package. This compact device package may allow a use of the voltage clamping devices 102a and 102b in applications where physical space utilized by the devices 102a and 102b is a concern. Moreover, the voltage clamping devices 102a and 102b may comply with individual apparatus requirements of an intrinsically safe standard, which requirements allow for less redundancy in an implementation of the voltage clamping devices 102a and 102b than would otherwise be required in a more complex apparatus.

FIG. 2A illustrates an example circuit 200 which may be packaged as an intrinsically safe voltage clamping device, such as one of the voltage clamping devices 102a and 102b. Although, the example circuit 200 is described below with reference to certain components, it is clear that any suitable values and types of components may be utilized to provide the voltage clamping and thermal limiting functionality of the circuit 200.

The example circuit 200 includes a shunt regulator assembly 201 configured to clamp a voltage applied across a regulated rail 202 and a ground rail 204 to a safety clamp voltage. The shunt regulator assembly may include one or more regulating components such as one or more resistors 206, an amplifier 208, a reference voltage 210 coupled to a non-inverting terminal of the amplifier 208, and a transistor 212 coupled to a voltage output terminal of the amplifier 208. In the example circuit 200, the amplifier 208 drives the transistor 212 according to the difference between the reference voltage 210 and the feedback voltage from the shunted regulated rail 202. As such, most of the power dissipated in the example circuit 200 will be dissipated in the transistor 212, and the transistor 212 may, in some cases, increase in temperature.

Such an increase in the temperature of the transistor 212, or in one or more other regulating components of the shunt regulator assembly 201, may activate the thermally activated component 214 which is thermally coupled to the transistor 212 (as indicated by the box 216). Activation of the thermally activated component 214 may correspond to a variety of changes in the thermally activated component 214. For example, the thermally activated component 214 may be an NTC thermistor which drops in resistance upon an increase in the temperature of the transistor 212. It is understood, however, that the thermally activated component 214 may include any suitable temperature sensor, such as a PTC thermistor, integrated circuit, etc. Alternatively, the circuit 200 may utilize an amplifier to compare an actual temperature of the transistor 212 to a targeted maximum temperature or threshold.

Upon activation, the thermally activated component 214 causes one or more limiting components, such as a transistor 218, to reduce the power dissipated in regulating components, such as the transistor 212. In one example scenario in which an NTC thermistor is implemented as the thermally activated component 214, the thermistor 214, acting as part of a temperature-dependent voltage divider between the regulated rail and ground rail, varies the voltage at the base of the transistor 218, and may decrease in resistance (i.e., increase the voltage at the base of the transistor 218) enough to "turn on" the transistor 218. That is, the voltage drop across the thermally activated component 214 may decrease so as to increase the voltage difference between the base and the emitter of the transistor 218.

Such an increase may cause the transistor 212 to be turned on "harder" (e.g., the transistor current will increase) than dictated by the amplifier 208. As a result, the clamped voltage between the regulated rail 202 and the ground rail 204 will drop allowing a reduction in both the power dissipated in the transistor 212 and the temperature of the transistor 212.

The example circuit 200 may further include various other components (e.g., resistors and diodes) to adjust current, voltage, etc. values or ratings. In one case, the circuit 200 may be configured for applications in which 4-20 mA intrinsically safe circuits are used. As such, the current typically flowing in the example circuit 200 may be less than 25 mA, even though the circuit 200 may be rated for a maximum current of 130 mA. During normal operation, the circuit 200 may be able to operate with up to 25 mA being shunted. However, the circuit 200 may reduce a shunt voltage (e.g., via limiting components) to protect regulating components in the abnormal condition of up to 130 mA of current. Alternatively, the circuit 200 may be rated for up to 195 mA to meet overrating safety factors required by IS standards.

While depicted in FIG. 2A as bipolar junction transistors, the transistors 212 and 218 need not be BJTs and, instead, the circuit 200 may be designed with metal-oxide-semiconductor field effect transistor (MOSFET) technology, as will be readily appreciated.

In one scenario, a 6V shunt regulator shunting 25 mA would dissipate 150 mW. As such, the example circuit 200 may be able to dissipate this amount of power without going into a thermally limited mode (e.g., activating the thermally activated component 214). If the maximum temperature of the die of the transistor 212 is 150° C. and the device is operating in an 85° C. environment, a thermal resistance from die to ambient of 233° C./W would be adequate to provide a 30° C. operating margin. Further, if the circuit 200 is to be rated for 195 mA, the circuit 200 need only reduce the safety clamp voltage (e.g., via limiting components, such as a transistor 216) below 1.43V to keep the die temperature below 150° C. in such abnormal operating conditions.

Figure 2B:
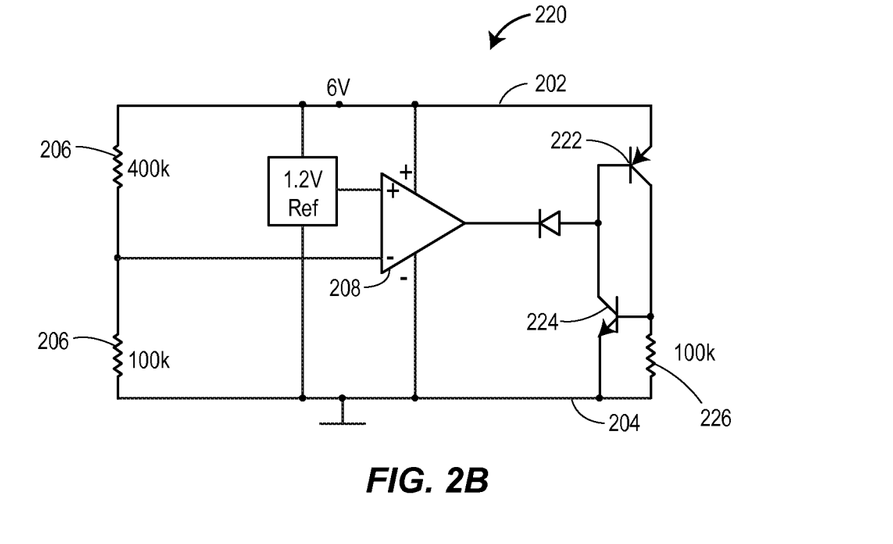
FIG. 2B illustrates another example circuit which may be packaged as an intrinsically safe voltage clamping device and implemented as one of the voltage clamping devices illustrated in FIG. 1.

FIG. 2B depicts another embodiment in which current sensing is used to control the thermal load of the regulating component. In FIG. 2B, an example circuit 220 functions much the same as the circuit in FIG. 2A. That is, during normal operation of the circuit 220, the amplifier 208 similarly drives a regulating transistor 222 according to the difference between the reference voltage and the feedback voltage from the regulated rail 202. Most of the power dissipated in the circuit 220 will be dissipated in the transistor 222. If the current being shunted by the transistor 222 is low enough (e.g., below 25 mA), a transistor 224 will be in cut-off. If the current being hunted by the transistor 224 through a resistor 226 is sufficient to drop enough voltage across the resistor 226 to turn on the transistor 224, then the transistor 224 will turn on the transistor 222, decreasing the clamp voltage of the circuit 220. The current-driven voltage limiting action of the transistor 224 will override the normal shunt voltage control (provided by the combination of the amplifier 208 and the transistor 222) until the current being shunted falls below the level where the transistor 224 is being turned on. For example, the circuit 220 is capable of shunting 20 mA at the designed clamp voltage of 6 V. If the current supplied to the circuit 220 were 200 mA, however, the voltage of the regulated rail 202 would fall below 1.4 V. The effect of the current-driven clamp voltage reduction is to limit the power dissipated in the transistor 222.

In other embodiments, the voltage across the resistor 226 may be amplified to more precisely control the current at which the clamp voltage is pulled down. In still other embodiments, a multiplier circuit can be implemented to pull down the voltage only as much as necessary to limit the power. However, these improvements are not strictly necessary to accomplish the intended thermal limitation function.

Figure 3A:
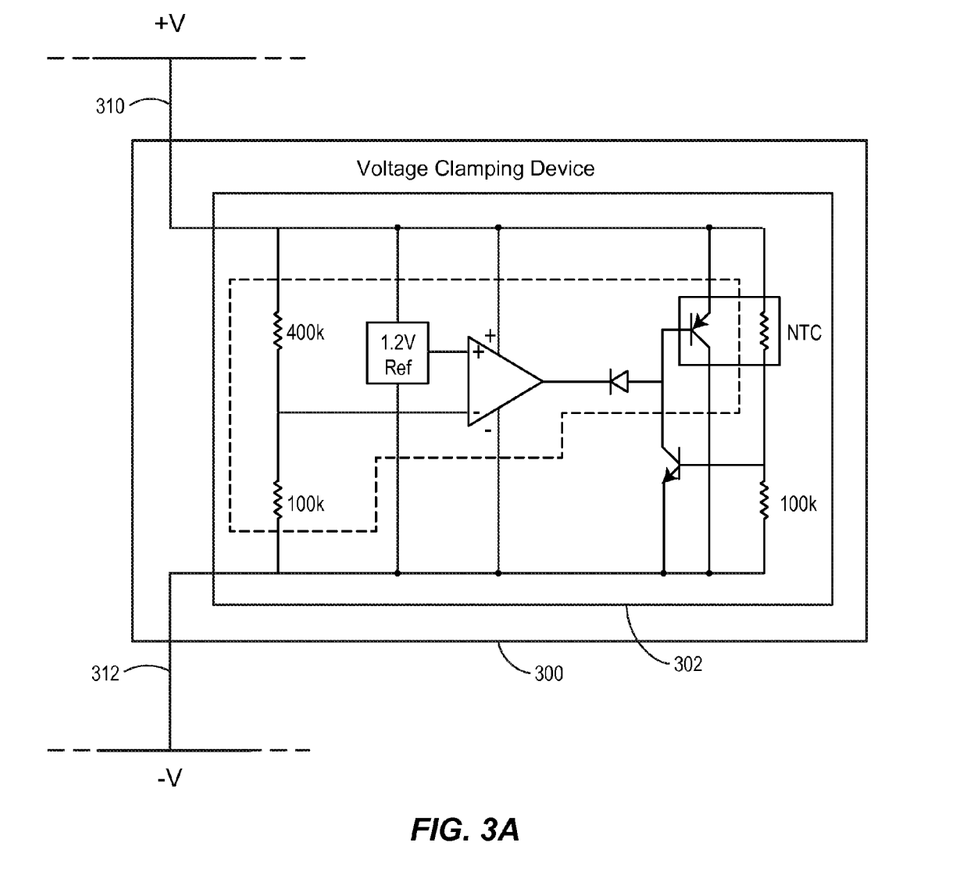
FIG. 3A-3C are block diagrams of example device packages in which intrinsically safe voltage clamping devices, such as the circuit illustrated in FIG. 2, can be packaged.
Figure 3B:
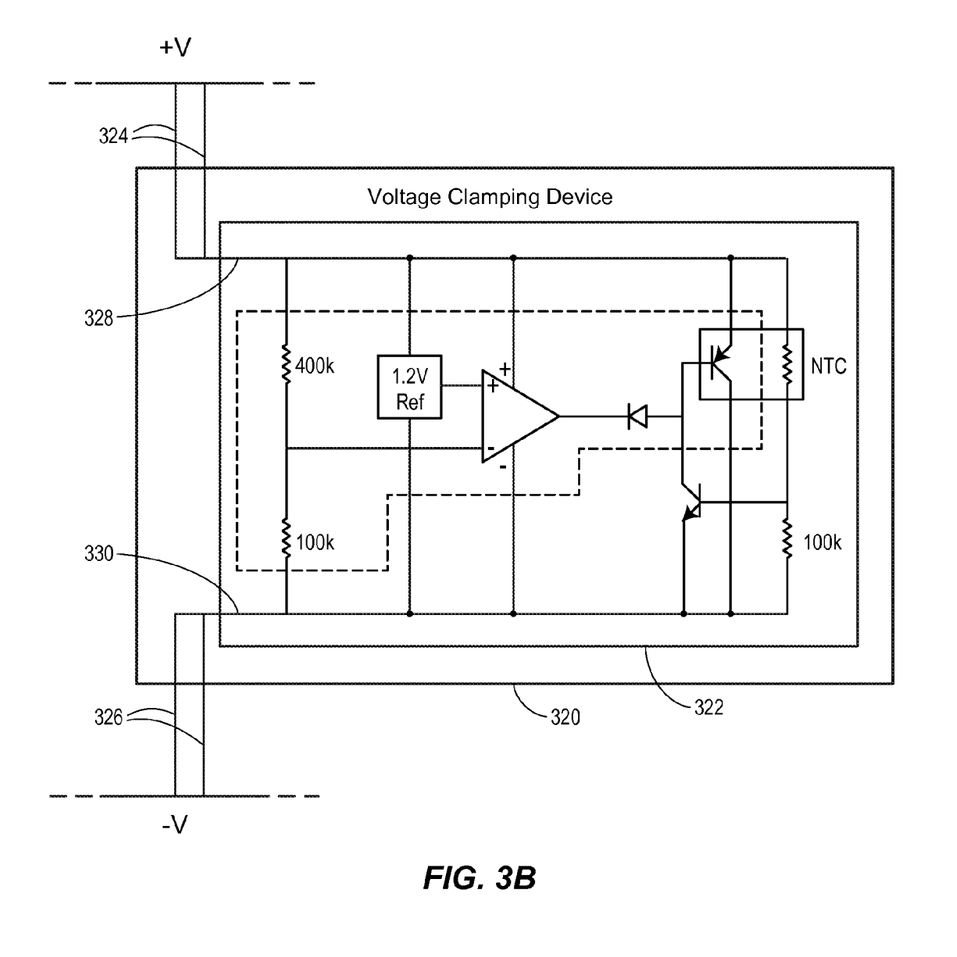
Figure 3C:
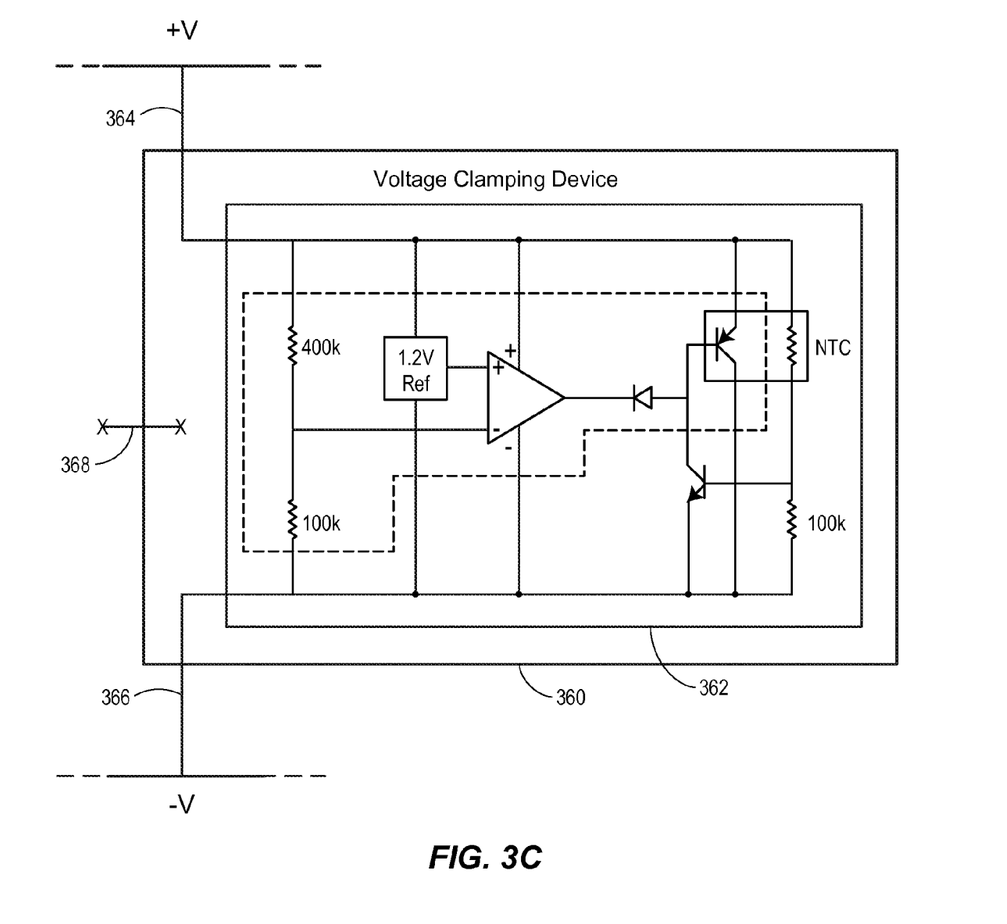

FIGS. 3A-3C illustrate example configurations of device packages in which intrinsically safe voltage clamping devices may be packaged. For example, the voltage clamping devices 102a and/or 102b or the circuits 200 or 220 may be packaged in a manner similar to that illustrated in FIGS. 3A-3C.

FIG. 3A is a block diagram of one example device package 300 in which an intrinsically safe voltage clamping device may be packaged. The device package 300 includes a set 302 of components configured to provide voltage clamping functionality and thermal limiting functionality, such as the sets of components (e.g., the circuit 200) illustrated in FIG. 2A or 2B. A power supply, such as the power supply 108, may apply a voltage to the components 302 via two leads 310 and 312, and the two leads 310 and 312 may, in this example package 300, be the only two leads external to the device package 300. The device package 300 may, in some cases, be manufactured or assembled in a manner that adheres to intrinsically safe standards. The device package 300 may be, for example, dust-tight and/or may meet clearance distance and mechanical requirements for a specific application. In addition, the materials used to construct the device package 300 may include materials selected based on electrical characteristics. Specifically, the materials of the device package 300 may fulfill certain electrostatic conditions to prevent an accumulation of static charge.

A two-lead device package, such as the device package 300, may also be held to different intrinsic safety requirements as compared with a voltage clamping circuit that is part of a larger device. Further, to adhere to an intrinsic safety standard, the device package 300 may be connected in parallel with a redundant voltage clamping device via the two leads 310 and 312. The redundant voltage clamping device may include similar components to the device package 300, but, in general, may include any suitable assembly of components, leads, and connections.

FIG. 3B is a block diagram of another example device package 320 in which an intrinsically safe voltage clamping device may be packaged. As with the device package 300, the device package 320 includes a set 322 of components configured to provide voltage clamping functionality and thermal limiting functionality. In this case, however, a power supply may apply a voltage to the components 322 via three or more leads 324 and 326 (three leads, four leads, five leads, etc.).

The three or more leads 324 and 326 of the device package 320 may be shorted together or otherwise combined or connected such that only two leads 328 and 330 are connected to the components 322 of the device package 320. Although FIG. 3B illustrated the leads 324 and 326 being connected inside of the device package 320, it is understood that the three or more leads 324 and 326 may be combined or connected external or internal to the device package 320.

A device package, such as the device package 320, may be subject to specific sections of an intrinsic safety standard due to the inclusion of more than two electronic leads. As such, the leads 324 and 326 may be selectively shorted together internally or externally without interference with the voltage clamping functionality of the device package 320, thereby maintaining adherence to a standard. Further, the device package 320 may be redundantly combined with other voltage clamping devices to maintain intrinsic safety.

FIG. 3C is a block diagram of yet another example device package 360 in which an intrinsically safe voltage clamping device may be packaged. The device package 360 also includes a set 362 of components configured to provide voltage clamping functionality and thermal limiting functionality. However, in addition to two leads 364 and 366, the device package 360 includes one or more additional leads 368. The one or more additional leads 368 may include unused pins of an integrated circuit (IC), leads of a power transistor package, etc.

Although the device package 360 includes the additional leads 368, the additional leads 368 may not be electrically connected to any other circuit component, (as indicated by an "X" in FIG. 3D). In this way, the device package 360 may ensure that the additional leads 368 may not interfere with voltage clamping functionality of the device package 360 and, in some cases, ensure that the device package 360 adheres to certain intrinsically safe standards. For example, a certain intrinsically safe standard may require an integrated circuit to remain safe with any combination of its leads electrically shorted.

Although FIGS. 3A-3C illustrate a certain number of distinct components, leads, and connection types, it is clear that a device package may include any number and combination of components, leads, and connection types. For example, a device package may include two, three, five, etc. leads coupled to both a regulated and ground rail, or a device package may include zero, one, two, etc. electronic leads in addition to two primary electronic leads (e.g., coupled to a power supply).

What is claimed is:

1. An intrinsically safe voltage clamping device comprising:
   a regulated rail;
   a ground rail;
   a shunt regulator assembly coupled to both the regulated rail and the ground rail and including one or more regulating transistors, the shunt regulator assembly configured to clamp a voltage applied across the regulated rail and the ground rail to a safety clamp voltage value; and a power-sensing component comprising:
(1) a thermally activated component configured to, when a temperature of at least one of the regulating transistors exceeds a threshold value, cause a limiting transistor to reduce a power dissipated in the at least one of the regulating transistors, or
(2) a current-sensing resistor, coupled to the ground rail, configured to, when the current through the current-sensing resistor exceeds a threshold value, cause a limiting transistor to reduce a power dissipated in at least one of the regulating transistors, wherein (i) a first terminal of the at least one of the regulating transistors is coupled to the limiting transistor, (ii) a second terminal of the at least one of the regulating transistors is coupled to the regulated rail, and (iii) a third terminal of the at least one of the regulating transistors is coupled to the current-sensing resistor.

2. The intrinsically safe voltage clamping device of claim 1, wherein the regulated rail, the ground rail, the shunt regulator assembly, the power-sensing component, and the limiting transistor are packaged together in a two-lead device package.

3. The intrinsically safe voltage clamping device of claim 1, wherein the regulated rail, the ground rail, the shunt regulator assembly, the power-sensing component, and the limiting transistor are packaged together in a device package having more than two leads.

4. The intrinsically safe voltage clamping device of claim 3, wherein the device package is a power transistor package.

5. The intrinsically safe voltage clamping device of claim 1, wherein the power-sensing component is the thermally activated component and wherein the thermally activated component is thermally coupled to the at least one of the regulating transistors by physical proximity.

6. The intrinsically safe voltage clamping device of claim 1, wherein the power-sensing component is the thermally activated component and wherein the thermally activated component is thermally coupled to the at least one of the regulating transistors by a thermal bonding agent.

7. The intrinsically safe voltage clamping device of claim 1, wherein the power-sensing component is the current-sensing resistor and wherein the current-sensing resistor is configured to cause the limiting transistor to put the at least one of the regulating transistors into saturation mode when the current sensed at the current-sensing resistor exceeds the threshold value.

8. A process control device comprising:
a device component having first and second terminals, the device component storing energy when a voltage is applied across the first and second terminals of the device component;
two or more voltage clamping devices electrically coupled to the device component, each voltage clamping device disposed in parallel with the other of the voltage clamping devices, and each voltage clamping device configured to clamp the voltage applied across the device component to a safety clamp voltage, each voltage clamping device comprising:
a shunt regulator assembly including one or more regulating transistors, and
a power-sensing component configured to, when a temperature or current exceeds a threshold value, cause a limiting transistor to reduce a power dissipated in at least one of the regulating transistors.

9. The process control device of claim 8, wherein each of the two or more voltage clamping devices is packaged in a device package having two external electronic leads.

10. The process control device of claim 8, wherein each of the two or more voltage clamping devices is packaged in a device package having two primary external electronic leads and one or more secondary external electronic leads.

11. The process control device of claim 10, wherein the secondary electronic leads of the device package are not electrically connected to anything inside the device package.

12. The process control device of claim 8, wherein the power-sensing component is a thermally-activated component and wherein the thermally activated component includes a temperature sensor and an amplifier.

13. The process control device of claim 8, wherein the power-sensing component is a thermally-activated component and wherein the thermally activated component includes a thermistor.

14. The process control device of claim 8, wherein the power-sensing component is a current-sensing resistor, and wherein the current-sensing resistor is configured to cause the limiting transistor to reduce a power dissipated in the at least of the regulating transistors when the current through the current-sensing resistor exceeds a threshold value.

15. A voltage clamping device comprising:
a regulated rail;
a ground rail;
a shunt regulator assembly including one or more regulating transistors and, configured to clamp a voltage applied across the regulated rail and the ground rail to a safety clamp voltage value; and
a power-sensing component configured to cause a limiting transistor to reduce a power dissipated in at least one of the regulating transistors, wherein
the regulated rail, the ground rail, the shunt regulator assembly, the power-sensing component, and the limiting transistor are packaged together in a single device package.

16. The voltage clamping device of claim 15, wherein the power-sensing component is a thermally activated component configured to cause the limiting transistor to reduce a power dissipated in the at least one of the regulating transistors.

17. The voltage clamping device of claim 15, wherein the power-sensing component is a current-sensing resistor configured to cause the limiting transistor to reduce a power dissipated in the at least one of the regulating transistors.

18. The voltage clamping device of claim 15, wherein the voltage clamping device meets the standards set for intrinsically safe devices.

* * * * *

UNITED STATES PATENT AND TRADEMARK OFFICE
CERTIFICATE OF CORRECTION

| | | |
|---|---|---|
| PATENT NO. | : 9,876,349 B2 | Page 1 of 1 |
| APPLICATION NO. | : 14/788199 | |
| DATED | : January 23, 2018 | |
| INVENTOR(S) | : Stephen G. Seberger | |

It is certified that error appears in the above-identified patent and that said Letters Patent is hereby corrected as shown below:

In the Specification

At Column 3, Line 36, "process control device 102a" should read -- process control device 106 --.

In the Claims

At Column 10, Line 30, "least of" should read -- least one of --.

Signed and Sealed this
Twelfth Day of May, 2020

Andrei Iancu
*Director of the United States Patent and Trademark Office*